(12) United States Patent
Hirayama et al.

(10) Patent No.: US 8,852,830 B2
(45) Date of Patent: Oct. 7, 2014

(54) PHOTOMASK AND SEMICONDUCTOR APPARATUS MANUFACTURING METHOD

(71) Applicant: Canon Kabushiki Kaisha, Tokyo (JP)

(72) Inventors: Satoshi Hirayama, Yokohama (JP); Atsushi Kanome, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 4 days.

(21) Appl. No.: 13/770,012

(22) Filed: Feb. 19, 2013

(65) Prior Publication Data

US 2013/0224637 A1  Aug. 29, 2013

(30) Foreign Application Priority Data

Feb. 24, 2012  (JP) ................................. 2012-039132

(51) Int. Cl.
*G03F 1/50* (2012.01)
*G03F 7/20* (2006.01)
*G03F 1/00* (2012.01)

(52) U.S. Cl.
CPC .. *G03F 1/00* (2013.01); *G03F 7/20* (2013.01); *G03F 7/2022* (2013.01); *G03F 1/50* (2013.01)
USPC ............... 430/5; 430/312; 430/328; 430/394; 430/396

(58) Field of Classification Search
CPC ............... G03F 1/00; G03F 1/50; G03F 7/20; G03F 7/2022
USPC ........................ 430/5, 22, 312, 328, 394, 396
See application file for complete search history.

(56) References Cited

U.S. PATENT DOCUMENTS 5,888,676 A    3/1999  Saitoh

FOREIGN PATENT DOCUMENTS

| JP | 1-276717 A | 11/1989 |
|----|-----------|---------|
| JP | 5-136020 A | 6/1993 |
| JP | 9-190962 A | 7/1997 |
| JP | 9-251954 A | 9/1997 |
| JP | 11-67639 A | 3/1999 |
| JP | 11-162836 A | 6/1999 |

*Primary Examiner* — Christopher Young
(74) *Attorney, Agent, or Firm* — Fitzpatrick, Cella, Harper & Scinto

(57) ABSTRACT

A photomask for exposing a region on a substrate, with a mask pattern, including a first line pattern, a second line pattern, a first connection pattern for a peripheral portion of the region and a second connection pattern for the peripheral portion, wherein the first connection pattern is wider than the first line pattern and the second connection pattern is wider than the second line pattern, a distance from a virtual line between the first line pattern and the second line pattern to a center line of the first connection pattern is larger than a distance from the virtual line to a center line of the first line pattern and a distance from the virtual line to a center line of the second connection pattern is larger than a distance from the virtual line to a center line of the second line pattern.

7 Claims, 5 Drawing Sheets

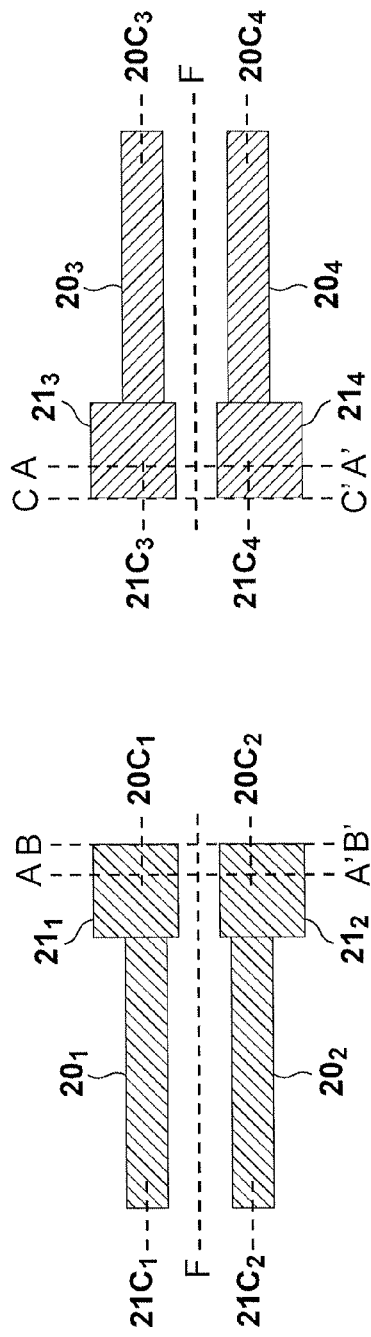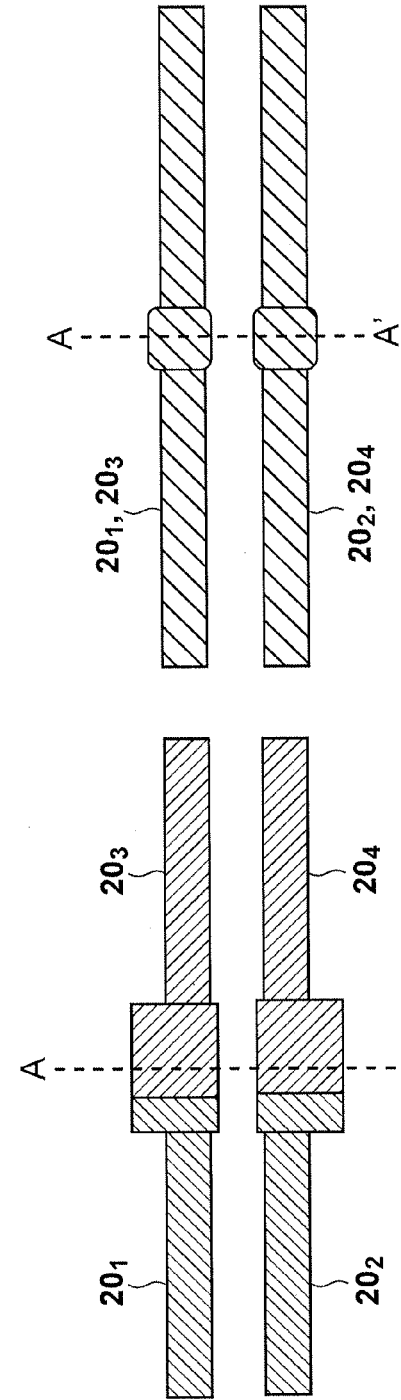

PHOTOMASK AND SEMICONDUCTOR APPARATUS MANUFACTURING METHOD

BACKGROUND OF THE INVENTION

1. Field of the Invention

The present invention relates to a photomask and a semiconductor apparatus manufacturing method.

2. Description of the Related Art

As a method of forming, on a substrate, a device or chip with a size larger than that of the maximum shot region of an exposure apparatus, there is a method for dividing a region in which a device or chip is to be formed into a plurality of regions, and individually exposing the plurality of regions. In such a case, a pattern which reflects an alignment error of a photomask can be formed on the boundary portion between these regions. Japanese Patent Laid-Open No. 1-276717, for example, discloses a method of increasing the width of a pattern for one of two adjacent regions of the plurality of regions, and transferring a pattern with a larger length to the other region.

However, in the method disclosed in Japanese Patent Laid-Open No. 1-276717, it is necessary to ensure a large interval between adjacent patterns according to the increase in width of the pattern, thus making it difficult to densely arrange these patterns.

SUMMARY OF THE INVENTION

The present invention provides a technique advantageous in terms of densely transferring adjacent patterns when a plurality of regions on a substrate are exposed individually.

One of the aspects of the present invention provides a photomask for exposing a region on a substrate, the photomask with a mask pattern including a first line pattern and a second line pattern arranged in a first direction to be adjacent to each other, a first connection pattern arranged in a portion corresponding to a peripheral portion of the region to be in contact with the first line pattern, and a second connection pattern arranged in the portion corresponding to the peripheral portion to be in contact with the second line pattern, wherein the first connection pattern has a width in a second direction perpendicular to the first direction, which is larger than a width of the first line pattern in the second direction, and the second connection pattern has a width in the second direction, which is larger than a width of the second line pattern in the second direction, a distance from a virtual line running in the first direction between the first line pattern and the second line pattern to a center line of the first connection pattern, is larger than a distance from the virtual line to a center line of the first line pattern, and a distance from the virtual line to a center line of the second connection pattern, is larger than a distance from the virtual line to a center line of the second line pattern.

Further features of the present invention will become apparent from the following description of exemplary embodiments with reference to the attached drawings.

BRIEF DESCRIPTION OF THE DRAWINGS

FIGS. 2A to 2D are views for explaining a photomask and an exposure process according to the first embodiment;

DESCRIPTION OF THE EMBODIMENTS

First Embodiment

Figure 1A:
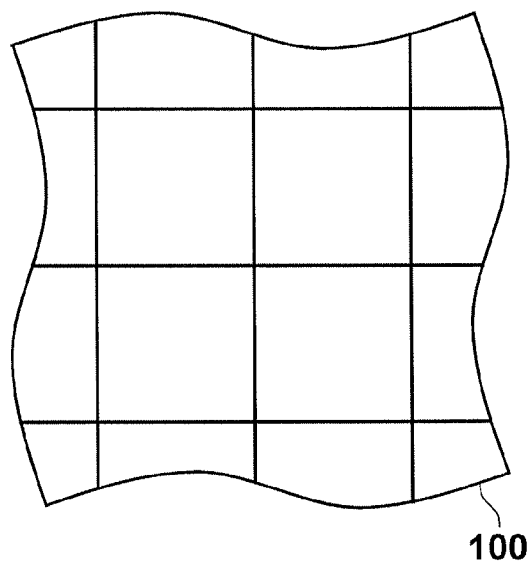
FIGS. 1A to 1C are views for explaining a plurality of regions to be exposed individually.
Figure 1B:
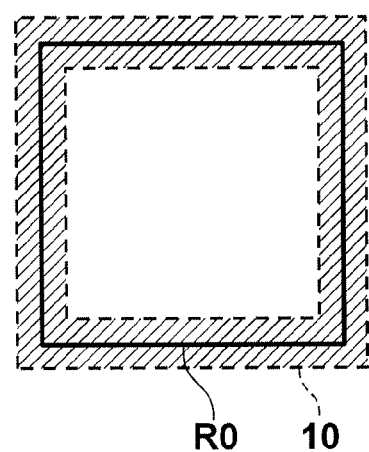

A photomask and a semiconductor apparatus manufacturing method (especially an exposure method) according to the first embodiment will be described with reference to FIGS. 1A to 3B. As illustrated in FIG. 1A, when a region in which a device or chip is to be formed on a substrate 100 is divided into a plurality of regions, and the plurality of regions are exposed individually, a portion (to be referred to as a "peripheral portion" hereinafter) which reflects an alignment error of a photomask is formed on the periphery of each region. FIG. 1B shows one region R0 of the plurality of regions, and its peripheral portion 10. The peripheral portion 10 includes inner and outer parts of the region R0. That is, the mask pattern of each photomask used in a corresponding exposure process includes the pattern of a region in which a device or chip is to be formed, and the pattern of the peripheral portion of the region. Line patterns to extend across the region R0 and adjacent regions, for example, are formed by being developed at once subsequently to an exposure process individually performed for each region. Hence, a plurality of exposure operations, that is, so-called multiple exposure is performed on the peripheral portion 10. Note that in each photomask, a connection pattern is arranged in a portion corresponding to the peripheral portion 10 so that these line patterns are connected to each other even if an alignment error of the mask position has occurred. This connection pattern serves to ensure connection between each region and an adjacent region even if an alignment error of a photomask has occurred when each region is exposed individually.

Figure 1C:
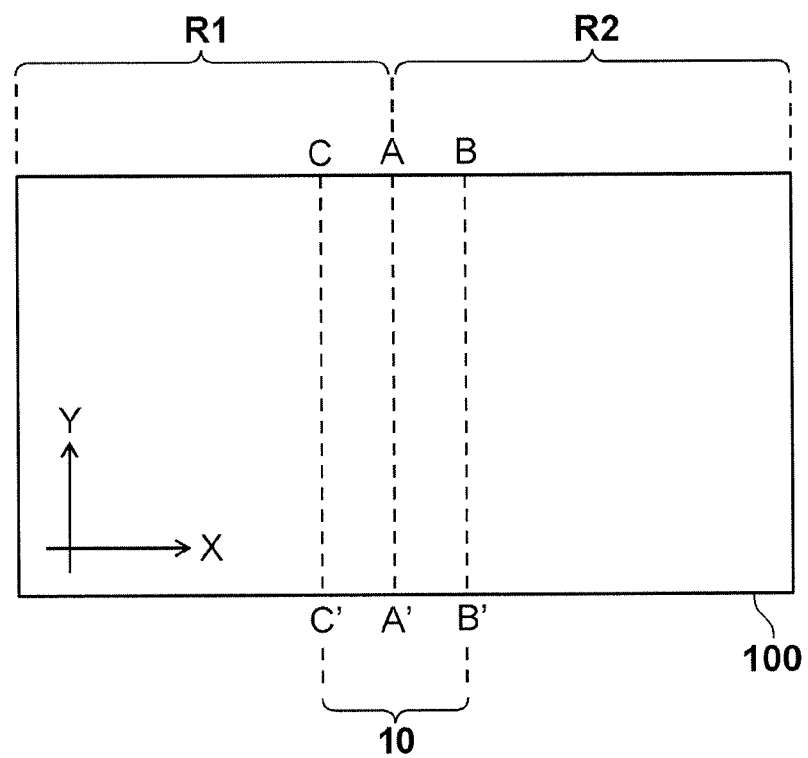

The case wherein a semiconductor integrated circuit pattern is formed by individually exposing two adjacent regions (a first region R1 and a second region R2) on a substrate, as illustrated in FIG. 1C, will be considered below. Note that FIG. 1C shows only one side of the peripheral portion 10 because these two regions are exposed. A line A-A' indicates the boundary between the first region R1 and the second region R2. The first region R1 contacts the second region R2 along the line A-A'. A region between lines B-B' and C-C' is the peripheral portion 10 (its one side). The distance between the lines A-A' and B-B', and that between the lines A-A' and C-C' can be, for example, is about 150 nm.

First, a first region R1 and its peripheral portion 10 on a substrate 100 coated with, for example, a positive photoresist material are exposed using a photomask for forming a pattern as illustrated in FIG. 2A (first step). The mask pattern of the photomask used in the first step includes a first line pattern $20_1$, second line pattern $20_2$, first connection pattern $21_1$, and second connection pattern $21_2$. The first line pattern $20_1$ and second line pattern $20_2$ are arranged along a first direction X to be adjacent to each other. The photomask includes a portion corresponding to the first region R1, and a portion corresponding to the peripheral portion 10. Each of the first line pattern $20_1$ and second line pattern $20_2$ is arranged in the portion corresponding to the first region R1. The first connection pattern $21_1$ is arranged in the portion corresponding to the peripheral portion 10 to be in contact with the first line pattern $20_1$. Also, the second connection pattern $21_2$ is arranged in the portion corresponding to the peripheral portion 10 to be in contact with the second line pattern $20_2$. Note that the first connection pattern $21_1$ has a width in a second direction Y perpendicular to the first direction X, which is larger than that of the first line pattern $20_1$. Also, the second connection pattern $21_2$ has a width in the second direction Y perpendicular to the first direction X, which is larger than that of the second line pattern $20_2$. The distance from a virtual line F to a center line $21C_1$ of the first connection pattern $21_1$ is larger than that from the virtual line F to a center line $20C_1$ of the first line pattern $20_1$. Also, the distance from the virtual line F to a center line $21C_2$ of the second connection pattern $21_2$ is larger than that from the virtual line F to a center line $20C_2$ of the second line pattern $20_2$.

Similarly, a second region R2 and its peripheral portion 10 are exposed using a photomask for forming a pattern having the same shape as mentioned above to be symmetric about a line A-A', as illustrated in FIG. 2B (second step). That is, the mask pattern of the photomask used in the second step includes a third line pattern $20_3$, fourth line pattern $20_4$, third connection pattern $21_3$, and fourth connection pattern $21_4$. The third and fourth line patterns $20_3$ and $20_4$ are arranged in the second region R2 along the first direction X to be adjacent to each other, and can be connected to the first and second line patterns $20_1$ and $20_2$, respectively, upon a subsequent development process. The third connection pattern $21_3$ is arranged in the portion corresponding to the peripheral portion 10 to be in contact with the third line pattern $20_3$. The fourth connection pattern $21_4$ is arranged in the portion corresponding to the peripheral portion 10 to be in contact with the fourth line pattern $20_4$. The third connection pattern $21_3$ has a width in the second direction Y perpendicular to the first direction X, which is larger than that of the third line pattern $20_3$. Also, the fourth connection pattern $21_4$ has a width in the second direction Y perpendicular to the first direction X, which is larger than that of the fourth line pattern $20_4$. The distance from the virtual line F to a center line $21C_3$ of the third connection pattern $21_3$ is larger than that from the virtual line F to a center line $20C_3$ of the third line pattern $20_3$. Also, the distance from the virtual line F to a center line $21C_4$ of the fourth connection pattern $21_4$ is larger than that from the virtual line F to a center line $20C_4$ of the fourth line pattern $20_4$. Note that the virtual line F is positioned between the first and third line patterns $20_1$ and $20_3$ and the second and fourth line patterns $20_2$ and $20_4$, and runs in the first direction X. And the virtual line F extends along the first direction X.

According to the above-mentioned method, it is possible to minimize, for example, the interval between adjacent connection patterns to keep the interval between adjacent line patterns to be ensured small, thereby more densely arranging these line patterns. Upon the first and second steps, a pattern illustrated in FIG. 2C is transferred. FIG. 2C is a schematic view of two superposed mask patterns. A development process is then performed to obtain a real pattern as illustrated in FIG. 2D. FIGS. 2A and 2B show the first to fourth connection patterns $21_1$ to $21_4$ which protrude from the first to fourth line patterns $20_1$ to $20_4$, respectively, on the side of the virtual line F. However, patterns with no protrusions may be used, and, for example, their ends may be aligned.

Figure 3A:
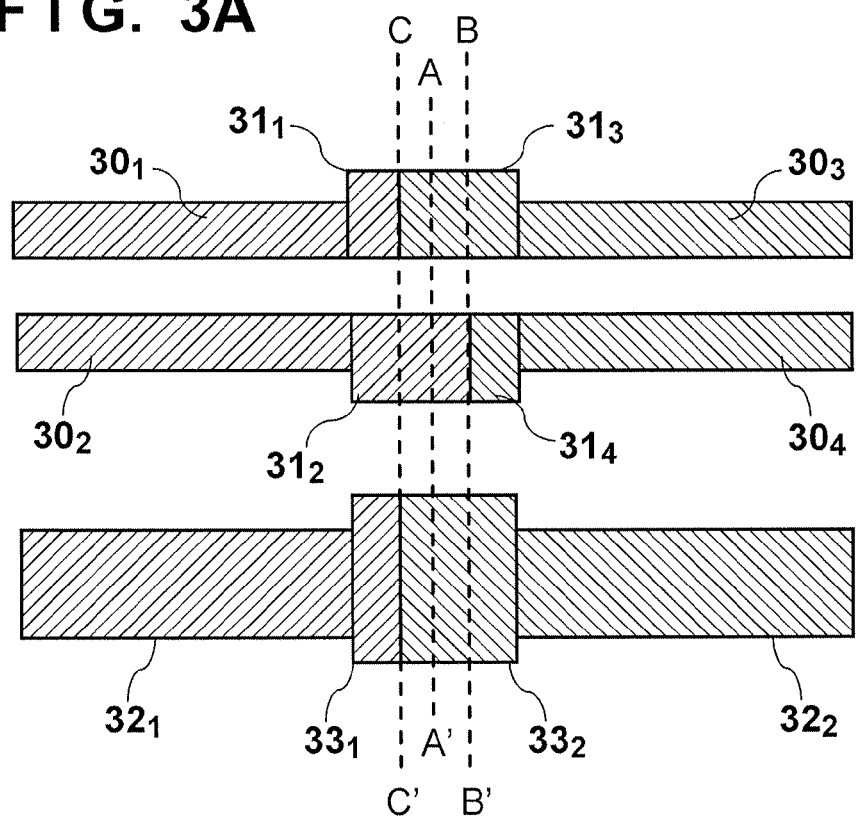
FIGS. 3A and 3B are views for explaining practical examples of the first embodiment.

FIG. 3A illustrates an example of a pattern which can use the above-mentioned method. FIG. 3A is a schematic view similar to that of FIG. 2C. For example, line patterns $30_1$ and $30_2$ are arranged at an interval of 280 nm, and line patterns $30_3$ and $30_4$ are arranged at an interval of 280 nm. Also, connection patterns $31_1$ to $31_4$ as mentioned above can be arranged. The connection patterns $31_1$ and $31_2$ have ends aligned with those of the line patterns $30_1$ and $30_2$ on the side on which the line patterns $30_1$ and $30_2$ have a smaller interval between them, and ends which respectively protrude by 100 nm at its opposite end. The same applies to the connection patterns $31_3$ and $31_4$. At this time, connection patterns $33_1$ and $33_2$ corresponding to auxiliary patterns described in, for example, Japanese Patent Laid-Open No. 1-276717 may be formed on line patterns $32_1$ and $32_2$ sufficiently spaced apart from the line pattern $30_2$.

Figure 3B:
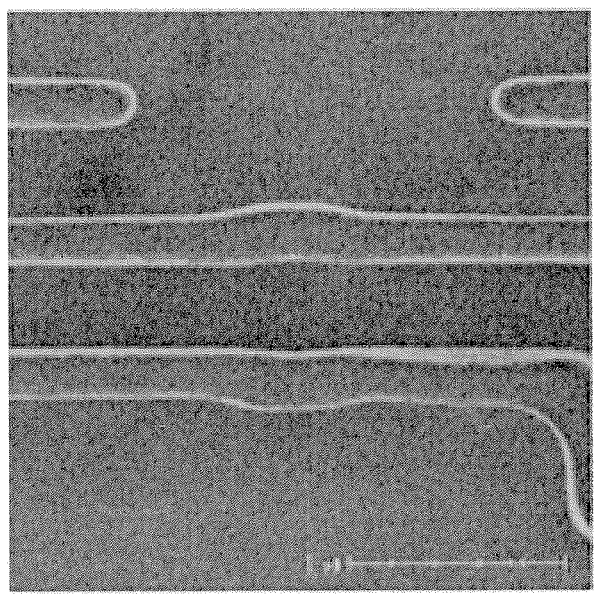

First and second steps were performed using a KrF exposure apparatus (wavelength: 248 nm), and a development process was then performed to obtain a wiring pattern as shown in FIG. 3B. Exposure (so-called double exposure) is repeatedly performed on the peripheral portion 10 by two individual exposure processes. Hence, an actually formed pattern becomes narrower (or shorter) than the product of the dimension (width or length) of the pattern of the mask and the projection magnification. However, according to the above-mentioned method, it is possible to prevent pattern peeling such as wiring disconnection on the boundary portion between two regions to be exposed individually, and short-circuiting between adjacent patterns.

As described above, according to this embodiment, in a semiconductor apparatus manufacturing method of individually exposing a plurality of regions on a substrate, densely adjacent patterns can be formed. Although each connection pattern is arranged in the portion corresponding to the region of the peripheral portion 10, that is, a region to undergo double exposure, it may be larger than this region. Also, although a positive photoresist material is used in this embodiment, a negative photoresist material may be used. The same applies to the following embodiments.

Second Embodiment

A photomask and a semiconductor apparatus manufacturing method (especially an exposure method) according to the second embodiment will be described with reference to FIGS. 4A to 4D. As in the first embodiment, the case wherein a semiconductor integrated circuit pattern is formed by individually exposing two adjacent regions (a first region R1 and a second region R2) on a substrate will be considered below.

Figure 4A:
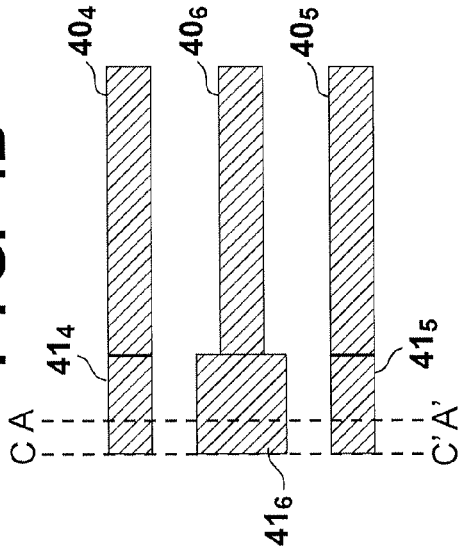
FIGS. 4A to 4D are views for explaining a photomask and an exposure process according to the second embodiment.

First, a first region R1 and its peripheral portion 10 on a substrate 100 coated with, for example, a positive photoresist material are exposed using a photomask for forming a pattern as illustrated in FIG. 4A (first step). The mask pattern of the photomask used in the first step includes first to third line patterns $40_1$ to $40_3$ and first to third connection patterns $41_1$ to $41_3$. Each of the first line pattern $40_1$ and second line pattern $40_2$ is arranged in the first region R1 along a first direction X. The third line pattern $40_3$ is arranged in the first region R1 along the first direction X between the first line pattern $40_1$ and the second line pattern $40_2$. The first connection pattern $41_1$ is arranged on the peripheral portion 10 to be in contact with the first line pattern $40_1$. The second connection pattern $41_2$ is arranged on the peripheral portion 10 to be in contact with the second line pattern $40_2$. The third connection pattern $41_3$ is arranged on the peripheral portion 10 to be in contact with the third line pattern $40_3$. Note that the first connection pattern $41_1$ of the first to third connection patterns $41_1$ to $41_3$ has a width in a second direction Y perpendicular to the first direction X, which is larger than that of the first line pattern $40_1$. Also, the second connection pattern $41_2$ of the first to third connection patterns $41_1$ to $41_3$ has a width in the second direction Y perpendicular to the first direction X, which is larger than that of the second line pattern $40_2$.

Figure 4B:
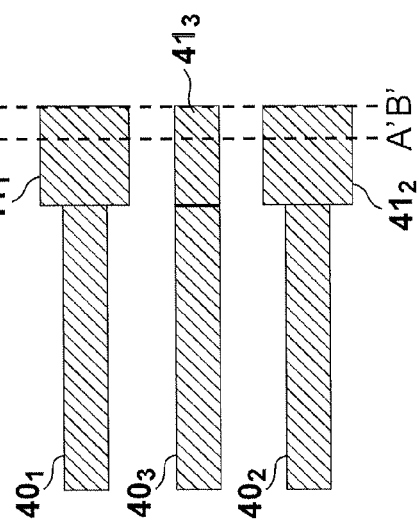

Next, the second region R2 and its peripheral portion 10 are exposed using a photomask for forming a pattern as illustrated in FIG. 4B (second step). That is, the mask pattern of the photomask used in the second step includes fourth to sixth line patterns $40_4$ to $40_6$ and fourth to sixth connection patterns $41_4$ to $41_6$. Each of the fourth line pattern $40_4$ and fifth line pattern $40_5$ is arranged in the second region R2 along the first direction X. The fourth line pattern $40_4$ can be connected to the first line pattern $40_1$ upon a subsequent development process. Also, the fifth line pattern $40_5$ can be connected to the second line pattern $40_2$ upon a subsequent development process. The sixth line pattern $40_6$ is arranged in the first region R1 along the first direction X between the fourth line pattern $40_4$ and the fifth line pattern $40_5$. The fourth connection pattern $41_4$ is arranged in the peripheral portion 10 to be in contact with the fourth line pattern $40_4$. The fifth connection pattern $41_5$ is arranged in the peripheral portion 10 to be in contact with the second line pattern $40_2$. The sixth connection pattern $41_6$ is arranged in the peripheral portion 10 to be in contact with the third line pattern $40_3$. The sixth connection pattern $41_6$ of the fourth to sixth connection patterns $41_4$ to $41_6$ has a width in the second direction Y perpendicular to the first direction X, which is larger than that of the sixth line pattern $40_6$. The first, second, and sixth connection patterns $41_1$, $41_2$, and $41_6$ of the first to sixth connection patterns $41_1$ to $41_6$ have features as described above.

For example, the first, third, and second line patterns $40_1$, $40_3$, and $40_2$ are sequentially arranged at distances of 170 nm. Similarly, the fourth, fifth, and sixth line patterns $40_4$, $40_5$, and $40_6$ are sequentially arranged at distances of 170 nm. Each of the first to third connection patterns $41_1$ to $41_3$ protrudes toward the second region R2 by, for example, about 50 to 150 nm from a line A-A' on the peripheral portion. Similarly, each of the fourth to sixth connection patterns $41_4$ to $41_6$ protrudes toward the first region R1 by, for example, about 50 to 150 nm from the line A-A' on the peripheral portion. The first connection pattern $41_1$ has two ends which respectively protrude by, for example, about 20 to 30 nm from the first line pattern $40_1$. Each of the second and sixth connection patterns $41_2$ and $41_6$ has two ends which respectively protrude in the same way.

Figure 4C:
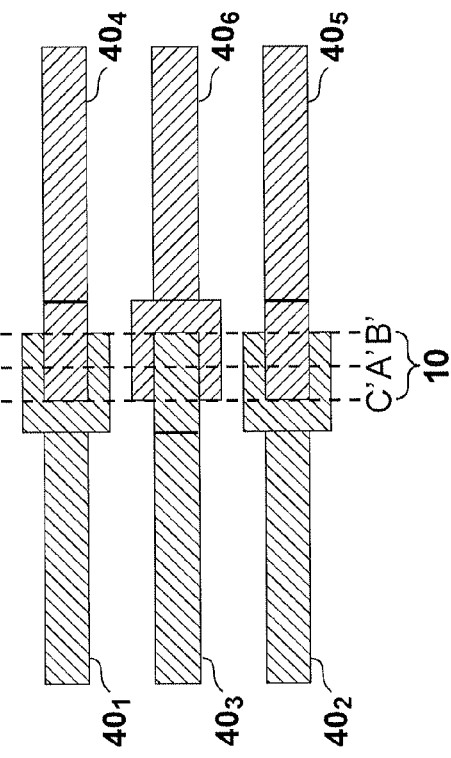
Figure 4D:
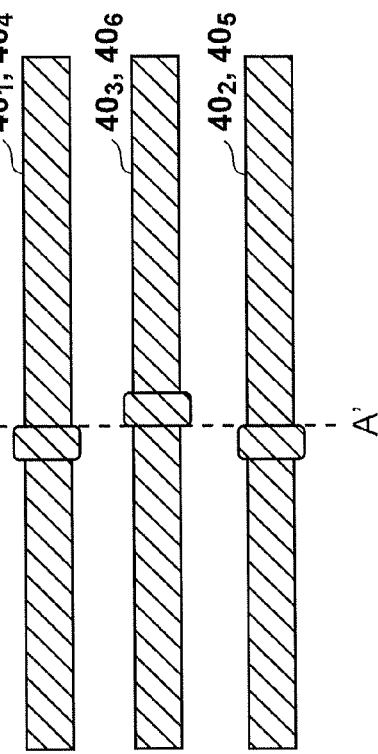

First and second steps are performed using a KrF exposure apparatus (wavelength: 248 nm), a pattern illustrated in FIG. 4C is transferred, and a development process is then performed to obtain a real pattern as illustrated in FIG. 4D. As in the first embodiment, double exposure is performed on the peripheral portion 10. Note that in this embodiment, each of the first and second connection patterns $41_1$ and $41_2$ having a width (to the left of a line C-C') larger than that of the peripheral portion 10 is arranged. Also, the sixth connection pattern $41_6$ having a width (to the left of a line B-B') larger than that of the peripheral portion 10 is arranged. Therefore, a pattern obtained after a development process has a staggered arrangement so that portions with large pattern widths are not adjacent to each other.

As described above, according to this method, it is possible to prevent pattern peeling such as wiring disconnection on the boundary portion between two regions to be exposed individually, and short-circuiting between adjacent patterns. Hence, in a semiconductor apparatus manufacturing method of individually exposing a plurality of regions on a substrate, densely adjacent patterns can be formed.

Third Embodiment

Figure 5A:
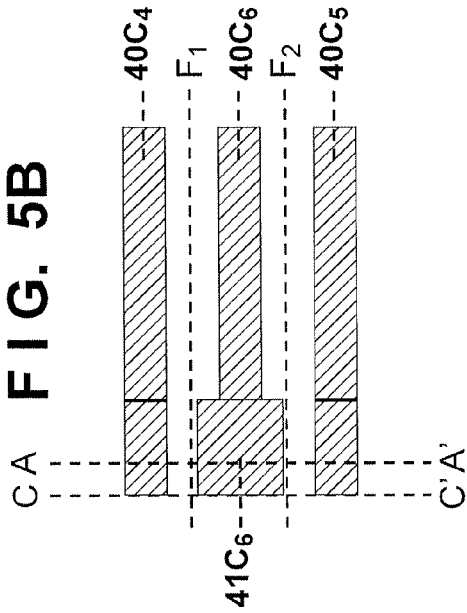
FIGS. 5A to 5D are views for explaining a photomask and an exposure process according to the third embodiment.
Figure 5B:
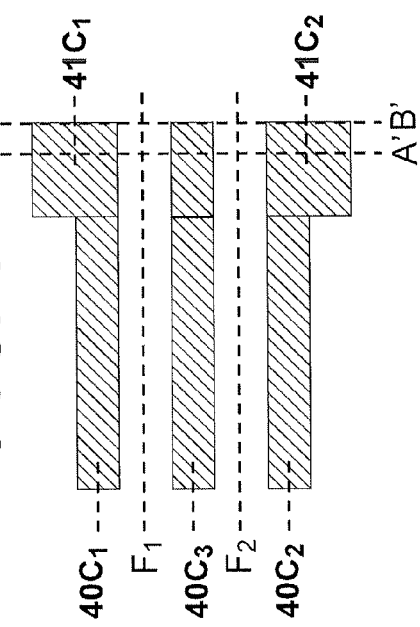

The third embodiment will be described with reference to FIGS. 5A to 5D. The third embodiment is different from the second embodiment in the following points. First, the distance from a virtual line $F_1$ to a center line $41C_1$ of a first connection pattern $41_1$ is larger than that from the virtual line $F_1$ to a center line $40C_1$ of a first line pattern $40_1$, as shown in FIG. 5A. Note that the virtual line $F_1$ runs in a first direction X between the first line pattern $40_1$ and a third line pattern $40_3$. Also, the distance from a virtual line $F_2$ to a center line $41C_2$ of a second connection pattern $41_2$ is larger than that from the virtual line $F_2$ to a center line $40C_2$ of a second line pattern $40_2$, as shown in FIG. 5B. Note that the virtual line $F_2$ runs in the first direction X between the second line pattern $40_2$ and the third line pattern $40_3$. The virtual line $F_1$ and the Virtual line $F_2$ extend along the first direction X.

For example, the first to third connection patterns $41_1$ to $41_3$ protrude toward a second region R2 by, for example, about 50 to 150 nm from a line A-A' on the peripheral portion. The first connection pattern $41_1$ has ends aligned with those of the first line pattern $40_1$ on the side on which its patterns have a smaller interval between them, and ends which respectively protrude by, for example, about 20 to 30 nm nm at its opposite end. Similarly, the second connection pattern $41_2$ has ends aligned with those of the second line pattern $40_2$ on the side on which its patterns have a smaller interval between them, and ends which respectively protrude by, for example, about 20 to 30 nm at its opposite end. Fourth to sixth connection patterns $41_4$ to $41_6$ protrude toward a first region R1 by, for example, about 50 to 150 nm from a line A-A' on the peripheral portion. The sixth connection pattern $41_6$ has two ends which respectively protrude by, for example, about 20 to 30 nm from a sixth line pattern $40_6$.

Figure 5C:
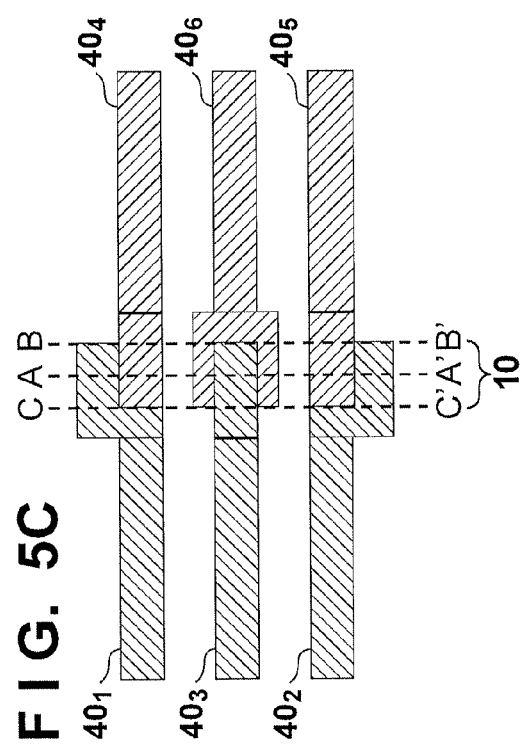
Figure 5D:
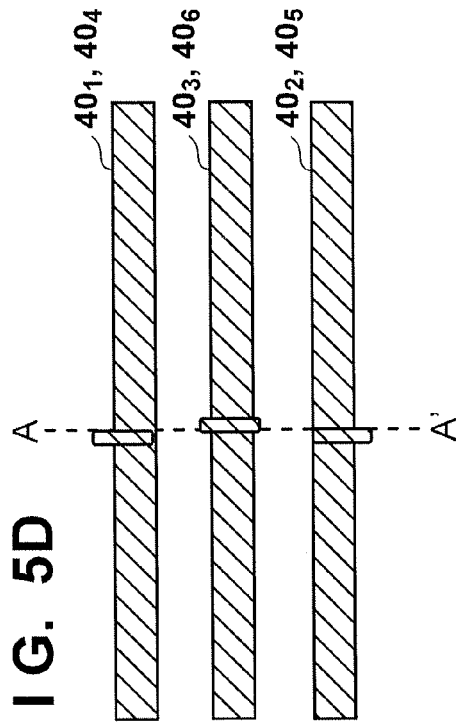

With this operation, the first and second connection patterns $41_1$ and $41_2$ and sixth connection pattern $41_6$ can be transferred so that the respective protruding portions are not adjacent to each other. More specifically, first and second steps are performed using a KrF exposure apparatus (wavelength: 248 nm), a pattern illustrated in FIG. 5C is transferred, and a development process is then performed to obtain a pattern as illustrated in FIG. 5D. Note that on a peripheral portion 10, double exposure is performed, and a pattern (FIG. 5D) obtained after a development process is arranged so that portions with large pattern widths are not adjacent to each other.

As described above, according to this method, it is possible to prevent pattern peeling such as wiring disconnection on the boundary portion between two regions to be exposed individually, and short-circuiting between adjacent patterns. Hence, in a semiconductor apparatus manufacturing method of individually exposing a plurality of regions on a substrate, densely adjacent patterns can be formed.

Although three embodiments have been described above, the present invention is not limited to them, and the object, state, use purpose, function, and other specifications can be changed as needed, so the present invention can also be practiced by other embodiments, as a matter of course. In the above exemplary embodiments, a direction of a boundary line extends along a vertical direction in a plan view of a solid-state image sensor and the boundary line is only one. However, the direction of the boundary line can be defined as extending along any direction such as a horizontal direction in the plan view, and the number of the boundary lines can be more than one.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-039132, filed Feb. 24, 2012, which is hereby incorporated by reference herein in its entirety.

What is claimed is:

1. A photomask for exposing a region on a substrate,
the photomask having a mask pattern including a first line pattern arranged along the first direction, a second line pattern arranged along the first direction and arranged adjacent to the first line pattern, a first connection pattern arranged in a portion corresponding to a peripheral portion of the region to be in contact with the first line pattern, and a second connection pattern arranged in the portion corresponding to the peripheral portion to be in contact with the second line pattern,
wherein the first connection pattern has a width in a second direction perpendicular to the first direction, which is larger than a width of the first line pattern in the second direction, and the second connection pattern has a width in the second direction, which is larger than a width of the second line pattern in the second direction, and
a distance, from a virtual line extending along the first direction and arranged between the first line pattern and the second line pattern to a center line of the first connection pattern, is larger than a distance from the virtual line to a center line of the first line pattern.

2. The photomask according to claim 1,
wherein a distance from the virtual line to a center line of the second connection pattern, is larger than a distance from the virtual line to a center line of the second line pattern.

3. A photomask for exposing a region on a substrate,
the photomask having a mask pattern including a first line pattern arranged along a first direction, a second line pattern arranged along the first direction, a third line pattern arranged along the first direction and arranged between the first line pattern and the second line pattern, a first connection pattern arranged in a portion corresponding to a peripheral portion of the region to be in contact with the first line pattern, a second connection pattern arranged in the portion corresponding to the peripheral portion to be in contact with the second line pattern, and a third connection pattern arranged in the portion corresponding to the peripheral portion to be in contact with the third line pattern,
wherein the first connection pattern has a width in a second direction perpendicular to the first direction, which is larger than a width of the first line pattern in the second direction, and the second connection pattern has a width in the second direction, which is larger than a width of the second line pattern in the second direction.

4. The photomask according to claim 3, wherein
a distance from a first virtual line extending along the first direction and arranged between the first line pattern and the third line pattern to a center line of the first connection pattern, is larger than a distance from the first virtual line to a center line of the first line pattern, and
a distance from a second virtual line extending along the first direction and arranged between the second line pattern and the third line pattern to a center line of the second connection pattern, is larger than a distance from the second virtual line to a center line of the second line pattern.

5. A photomask for exposing a region on a substrate,
the photomask having a mask pattern including a first line pattern arranged along a first direction, a second line pattern arranged along the first direction, a third line pattern arranged along the first direction and arranged between the first line pattern and the second line pattern, a first connection pattern arranged in a portion corresponding to a peripheral portion of the region to be in contact with the first line pattern, a second connection pattern arranged in the portion corresponding to the peripheral portion to be in contact with the second line pattern, and a third connection pattern arranged in the portion corresponding to the peripheral portion to be in contact with the third line pattern,
wherein the third connection pattern has a width in a second direction perpendicular to the first direction, which is larger than a width of the third line pattern in the second direction.

6. A semiconductor apparatus manufacturing method of forming a semiconductor integrated circuit pattern by individually exposing a first region and a second region adjacent to each other on a substrate, the method comprising:
a first step of exposing the first region and a peripheral portion of the first region on the substrate, using a photomask including a first line pattern arranged in a portion corresponding to the first region along a first direction, a second line pattern arranged adjacent to the first line pattern, a first connection pattern arranged in a portion corresponding to the peripheral portion of the first region to be in contact with the first line pattern, and a second connection pattern arranged in the portion corresponding to the peripheral portion of the first region to be in contact with the second line pattern; and
a second step of exposing the second region and a peripheral portion of the second region on the substrate, using a photomask including a third line pattern which is arranged in a portion corresponding to the second region along the first direction and is to be connected to the first line pattern, a fourth line pattern which is arranged adjacent to the third line pattern and is to be connected to the second line pattern, a third connection pattern arranged in a portion corresponding to the peripheral portion of the second region to be in contact with the third line pattern, and a fourth connection pattern arranged in the portion corresponding to the peripheral portion of the second region to be in contact with the fourth line pattern,
wherein the first connection pattern has a width in a second direction perpendicular to the first direction, which is larger than a width of the first line pattern in the second direction, the second connection pattern has a width in the second direction, which is larger than a width of the second line pattern in the second direction, the third connection pattern has a width in the second direction, which is larger than a width of the third line pattern in the second direction, and the fourth connection pattern has a width in the second direction, which is larger than a width of the fourth line pattern in the second direction, and
a distance, from a virtual line extending along the first direction, arranged both between the first line pattern and the second line pattern and between the third line pattern and the fourth line pattern, to a center line of the first connection pattern, is larger than a distance from the virtual line to a center line of the first line pattern, a distance from the virtual line to a center line of the second connection pattern is larger than a distance from the virtual line to a center line of the second line pattern, a distance from the virtual line to a center line of the third connection pattern is larger than a distance from the virtual line to a center line of the third line pattern, and a distance from the virtual line to a center line of the fourth connection pattern is larger than a distance from the virtual line to a center line of the fourth line pattern.

7. A semiconductor apparatus manufacturing method of forming a semiconductor integrated circuit pattern by individually exposing a first region and a second region adjacent to each other on a substrate, the method comprising:

exposing the first region and a peripheral portion of the first region on the substrate, using a photomask including a first line pattern and a second line pattern arranged in a portion corresponding to the first region along a first direction, a third line pattern arranged in the first region along the first direction between the first line pattern and the second line pattern, a first connection pattern arranged in a portion corresponding to the peripheral portion of the first region to be in contact with the first line pattern, a second connection pattern arranged in the portion corresponding to the peripheral portion of the first region to be in contact with the second line pattern, and a third connection pattern arranged in the portion corresponding to the peripheral portion of the first region to be in contact with the third line pattern; and exposing the second region and a peripheral portion of the second region on the substrate, using a photomask including a fourth line pattern which is arranged in a portion corresponding to the second region along the first direction and is to be connected to the first line pattern, a fifth line pattern which is arranged in the portion corresponding to the second region along the first direction and is to be connected to the second line pattern, a sixth line pattern arranged in a portion corresponding to the second region along the first direction between the fourth line pattern and the fifth line pattern, a fourth connection pattern arranged in the portion corresponding to the peripheral portion of the second region to be in contact with the fourth line pattern, a fifth connection pattern arranged in the portion corresponding to the peripheral portion of the second region to be in contact with the fifth line pattern, and a sixth connection pattern arranged in the portion corresponding to the peripheral portion of the second region to be in contact with the sixth line pattern, wherein the first connection pattern has a width in a second direction perpendicular to the first direction, which is larger than a width of the first line pattern in the second direction, the second connection pattern has a width in the second direction, which is larger than a width of the second line pattern in the second direction, and the sixth connection pattern has a width in the second direction, which is larger than a width of the sixth line pattern in the second direction.

* * * * *